United States Patent
Zoodsma

(10) Patent No.: US 7,819,175 B2
(45) Date of Patent: Oct. 26, 2010

(54) HYBRID HEAT SINK WITH RECIRCULATING FLUID AND INTERLEAVING FINS

(75) Inventor: Randy J. Zoodsma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1144 days.

(21) Appl. No.: 11/296,556

(22) Filed: Dec. 7, 2005

(65) Prior Publication Data

US 2007/0125524 A1    Jun. 7, 2007

(51) Int. Cl.
H05K 7/20 (2006.01)

(52) U.S. Cl. ............................. 165/104.33; 165/80.4

(58) Field of Classification Search ............ 165/80.4, 165/80.5, 104.19, 104.26, 104.33
See application file for complete search history.

(56) References Cited

U.S. PATENT DOCUMENTS

| | | | | |
|---|---|---|---|---|
| 6,019,165 A | * | 2/2000 | Batchelder | 165/80.3 |
| 6,668,911 B2 | * | 12/2003 | Bingler | 165/80.4 |
| 6,863,119 B2 | | 3/2005 | Sugito et al. | 165/104.33 |
| 2004/0190250 A1 | * | 9/2004 | Iijima et al. | 361/697 |
| 2005/0103472 A1 | * | 5/2005 | Lofland et al. | 165/80.4 |

FOREIGN PATENT DOCUMENTS

CN     1588267 A     3/2005

* cited by examiner

*Primary Examiner*—Teresa J Walberg
(74) *Attorney, Agent, or Firm*—Geraldine D. Monteleone

(57) ABSTRACT

A method and incorporated hybrid air and liquid cooled heat sink that is provided for cooling electronic components. The heat sink comprises a finned structure having fins positioned for air to pass easily through them. The finned structure is flanked by a heat source plate on one side (closer to direction of heat flowing from electronic components) and a second plate on its opposing side such that both of the plates are in thermal communication with fin tips and fin base of the finned structure. The heat source plate itself is composed of two complementary halves with fins on each half. When brought together, the two halves form a unitary, fluid sealed plate while allowing passage of fluids through it by allowing the fins on each half to create and interleaving structure. A fluid re-circulator is also disposed at least partially in the plates for circulating fluids though the plates and the finned structure such that both fin tips and fin base are cooled.

20 Claims, 3 Drawing Sheets

HYBRID HEAT SINK WITH RECIRCULATING FLUID AND INTERLEAVING FINS

CROSS-REFERENCE TO RELATED APPLICATIONS

This application contains subject matter which is related to the subject matter of the following co-pending application, which is also assigned to the same assignee as this application, International Business Machines Corporation of Armonk, N.Y. and is by the same inventor. The application listed below, filed on the same day, is hereby incorporated herein by reference in its entirety: "Hybrid Heat Sink Performance Enhancement Using Recirculating Fluid" by R. J. Zoodsma and filed on the same day as this application and owned by the same assignee.

BACKGROUND OF THE INVENTION

1. Field of the Invention

This invention relates to cooling of electronic packages used in computing system environments and more particularly to cooling of electronic components used in a server or other such large computers.

2. Description of Background

The recent industry trend of continuously increasing the number of electronic components inside computing system environments has led to many challenges for the designers of these systems. One such challenges lies with the issue of heat dissipation. In smaller computing system environments, such as those that include one or several personal computers, the number of heat generating components are limited. In larger environments, however, such as those that include one or more computer networks in processing communication with one another, finding a solution for heat dissipation issues is more challenging.

Heat dissipation if unresolved, can result in electronic and mechanical failures that will affect overall system performance, no matter what the size of the environment. As can be easily understood, however, heat dissipation increases as the packaging density increases. Therefore, in larger computing system environments, the problem of heat dissipation becomes even more of a concern for the designers of these systems. In addition, in larger environments, thermal management solutions must be provided that take other needs of the system environment as a whole into consideration. In larger environments, improper heat dissipation can create a variety of other seemingly unrelated problems ranging from dynamic loading problems affecting structural rigidity of the computing system environment, to cost prohibitive solutions to provide proper air conditioning to customer sites where such computing system environments are being stored.

The prior art currently being practiced incorporate finned heat sinks in their designs in order to cool electronic components. As the number of electronic components have increased, designers of such systems have used a number of techniques to improve the capability of such finned heat sinks to improve thermal management.

In recent years, efforts have been made to change the fin material, fin thickness, fin height and fin pitch, among others, in order to improve the cooling capabilities of prior art heat sinks. Unfortunately, while most these efforts have been helpful in improving the transfer of heat up the fins, they have not been very effective in increasing the thermal capabilities. As an example, when the fin height was doubled, only a relatively small improvement was achieved. Furthermore, in this scenario, the tips of the fins ended up remaining significantly cooler than the fin base, indicating improper handling of heat dissipation.

In other approaches, attempts have been made to put a spreader plate on the top and bottom of the fins and then connect the plates to one another using pipes, particularly heat pipes. In this approach, the intent was to adjust the temperature of the fin base and tip so as to keep them at relatively similar temperatures. Unfortunately, heat limitations of heat pipes used in this approach alongside temperature drops associated with contact resistance of the heat pipes have limited the success associated with this approach.

Related application POU9-2005-0149 that is incorporated herein, introduces for a new and improved cooling arrangement using an air and liquid cooled hybrid heat sink designed to meet the current thermal management growing needs. In that application conduction is used particularly to maintain thermal management of both fin tips and fin base. The present invention provides further thermal management performance enhancements to this concept introduced by that application by further providing an on-the-chip solution that cools electronic components immediately in areas where thermal management is most needed. In addition, the current application uses convection to provide thermal management of the structure including fin tips and fin base.

SUMMARY OF THE INVENTION

The shortcomings of the prior art are overcome and additional advantages are provided through the provision of a method and incorporated hybrid heat sink that utilizes interleaving fin design to provide an enhanced thermal management solution. The heat sink comprises a finned structure having fins positioned for air to pass easily through them. The finned structure is flanked by a heat source plate on one side (closer to direction of heat flowing from electronic components) and a second plate on its opposing side such that both of the plates are in thermal communication with fin tips and fin base of the finned structure. The heat source plate itself is composed of two complementary halves with fins on each half. When brought together, the two halves form a unitary, fluid sealed plate while allowing passage of fluids through it by allowing the fins on each half to create and interleaving structure. A fluid re-circulator is also disposed at least partially in the plates for circulating fluids though the plates and the finned structure such that both fin tips and fin base are cooled.

In alternate embodiments, a substrate with attached electronic components can be used as one complementary half of the heat source plate, The fins on the substrate can be individually shaped in one embodiment of the invention but they will interleave with the fins on the complementary half when the two halves are brought together. In addition, a fluid seal can be provided between the two complementary halves of the heat source plate to ensure minimal fluid leakage.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
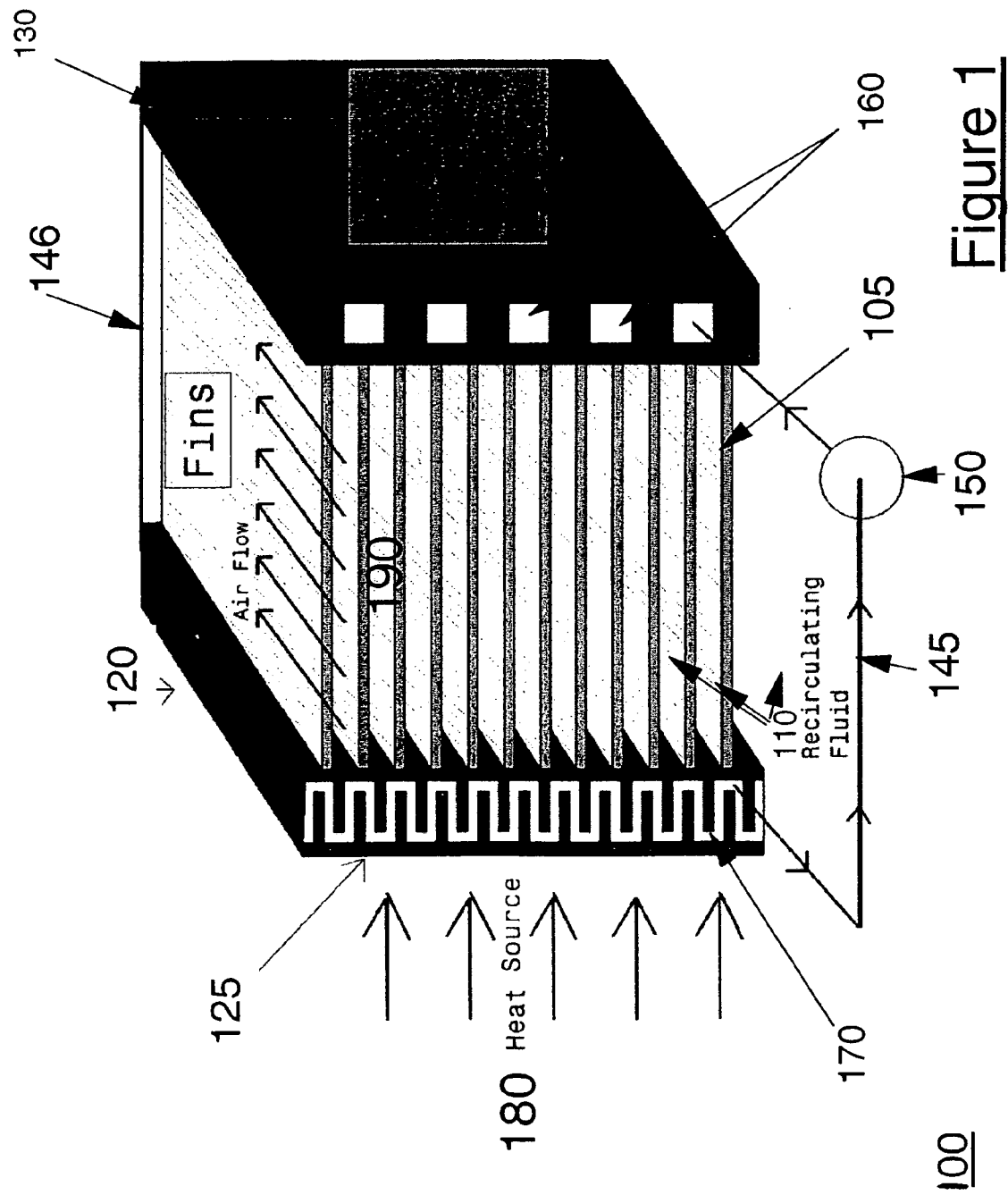
FIG. 1 is a cross sectional illustration of an overall view of one embodiment of the present invention.

FIG. 1 is cross sectional illustration of a heat sink assembly as per one embodiment of the present invention. FIG. 1 depicts a hybrid heat sink 100 that utilizes both air and fluids for cooling electronic components. The heat sink 100 is designed to provide an on-the chip cooling solution as will be further discussed in conjunction with FIG. 3. The arrangement of the embodiment provided in FIG. 1, however, can be used on its own to cool electronic components in a similar manner.

The heat sink 100 comprises of a finned structure 105 with one or a plurality of fins 110. The finned structure 105 is positioned between a heat source plate 120, placed closer to the heat generating components and a second plate 130. The heat source plate has an interleaving fluid cooled fin (125) design and is positioned on an opposing side of the second plate 130. The interleaving fin 125 design of heat source plate 120 still allows for passage of fluids, as illustrated by space 170. Furthermore, in this embodiment, the second plate 130 also has a perforated structure which will be discussed in greater detail below.

Figure 3:
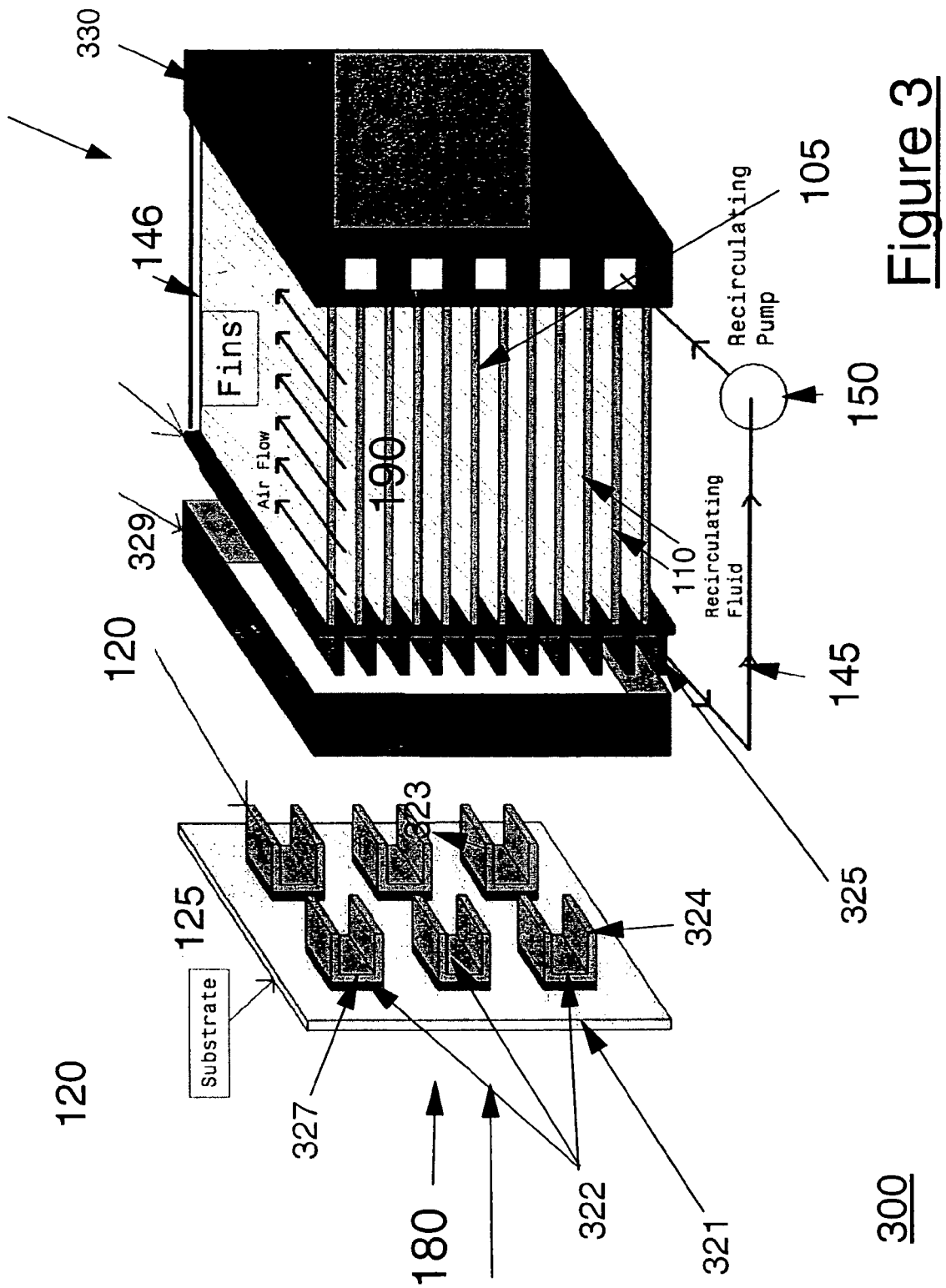
FIG. 3 is a cross sectional illustration of the embodiment of FIG. 2 having chip attached substrate.

In one embodiment, the fins 110 of the finned structure are embedded into either or both plates 120 and 130 and the finned structure 105 is secured at both sides to the plates 120 and 130 using means known to those skilled in the art. A preferred embodiment is shown in FIG. 3 and the exact arrangement of the fins 110 and fin structure 105 will be explored in more detail in conjunction with FIG. 3 in later discussions.

The plates 120 and 130 are both comprised of a thermally conductive material. In a preferred embodiment of the invention, the plates 120 and 130 are formed out of metal or metal compounds out of the same or different materials. This includes the interleaving fin portion (125) as will be discussed in greater detail in conjunction with FIG. 2. Similarly the finned structure 105 comprising individual fins 110 is also fabricated of a thermally conductive material such as metal and metal compounds that can be either similar or different than the material of the plates 120 and/or 130.

The heat sink 100 is cooled by means of a fluid re-circulator 140 as illustrated in the figure. In the embodiment provided in FIG. 1, the fluid re-circulator 140 forms a closed loop and is comprised of interleaving fins 125, one or more loops 145 and 146, which in this case are connected to the interleaving fins 125 and a circulator unit 150. In a preferred embodiment, the circulator unit is a pump, although other similar devices can be used. Loops 145 and 146, in a preferred embodiment comprise of piping. Coolant fluids are provided and collected by piping loop 145 and 146 to the interleaving fins 125 by pump 150. The pump 150, the piping loops 145 and 146, and the interleaving fins 125 in this way forming a closed loop themselves where the coolant fluid circulates. Coolant fluids will then be pumped or alternatively collected from the interleaving structure of plate 120 by loops (piping) 145-146 accordingly and circulated to other areas such as the finned structure 105 and second plate 130.

It should be noted that in alternate embodiments, it is also possible to provide more than one circulator unit 150, that are either housed together or separately according to cooling needs. Other arrangements can also be possible where a fluid supply or valves or other components or this nature are provided additionally. In any such arrangements, however, the end result should still yield a substantially closed fluid loop.

Coolant can be supplied in the loop prior to closing of the loop or on a continuous basis through the use of valves or other means that help maintain a substantially closed environment. Coolants can be pre-supplied. A variety of coolants, including water, may be used in conjunction with present invention as known to those skilled in the art.

In FIG. 1, the direction of the heat source 180 and air flow 190 are also depicted. The direction of the heat source, as provided by the arrows 180, is representative of the placement of the heat sink 100 in relation to the electronic heat producing components present on an electronics board, which are not illustrated in the depiction of FIG. 1 but is later discussed in conjunction with the preferred embodiment of FIG. 3. As discussed the heat source plate with interleaving plate 120 is disposed such that it is closest to the direction of heat flow.

The fin structure 105 is oriented such that the direction of air flow 190 can also be utilized in further cooling of the fins, therefore creating a hybrid air and liquid cooling assembly. The direction of the air flow 190, as depicted is such that it can pass over and through the fin structure 105, such as through the individual fins 110 and above and below them, such that air flow itself can cool the fins individually.

Referring back to FIG. 1, in a preferred embodiment, the closed fluid loop comprises of piping and a liquid re-circulating pump for circulating water inside the loop. However, the invention as discussed above can be used in conjunction with other similar combinations. The coolant used can be any non-conducting fluid.

Heat from the heat source, in this case that is generated by the electronic components, is totally convected to the fluid flowing between generated in the interleaving structure 125. Since the material of the structure is thermally conductive, this heat is transferred to the coolant fluid. The interleaving structure of heat source plate 120 provides more surface area and a better transfer of heat. The heat that is transferred to the re-circulating fluid, removes heat from one area of the fins (fin base) where they commonly remain and transfers it also to fin tips, resulting in a more uniform temperature gradient between fin parts in the fin structure 105. This is because the coolant is placed in thermal communication with the finned structure 105 and the heat source plate with interleaving fins of plate 120 such that fin base and fin tops of the finned structure 105 are in thermal communication with the plates 120 and 130. This redistribution of heat, consequently allows the heat sink 100 to utilize fin structure 105 in a more efficient manner. Once uniformity of temperature is established, fins 110 are then (uniformly) further cooled by air flow as referenced by 190.

It should be also noted that the piping 145 in this embodiment is at least partially embedded in the plates 120 and 130. This is partially due to the structure and design of cold plate 130 as illustrated. In this regard, it should be noted that while FIG. 1 provides a preferred embodiment of the present invention, other similar embodiments are also possible under the workings of the present invention.

In the embodiment of FIG. 1, to enhance thermal conductivity of the cold plate 130, as indicated earlier, a perforated design is implemented for second cold plate 130. The perforations 160 are provided so that a plurality of recirculating fluid loops can traverse through them. One purpose for the perforations, among others, is to increase the surface area such that better heat convection from the metal to the coolant fluid is possible. This will lead to better temperature control and minimal temperature differences between the fin base and fin tips.

While in the illustration of FIG. 1, piping loops 145 and 146 are provided at top and bottom of the heat sink 100, in alternate embodiments, it is possible to provide a plurality of loops. In such a case, it is even possible to have each such loop fabricated of different materials or that they are having different structures.

In different embodiments, the perforations 160 can be made such that they are lined up and equidistantly organized in a column as provided by the illustration of FIG. 1, or randomly organized. Accordingly the piping loops, if a plurality are used, can be disposed on parallel or intersecting planes depending on the manner of perforation such that one or more loops traverse through the perforations 160 and the interleaving space 170, in some embodiments.

In addition, the piping loops whether in the same plane or oriented on intersecting planes can be all connected to one circulating unit 160 or to a plurality of such units. Consequently, it is possible to selectively provide each closed fluid loop with an exclusive coolant unit or an arrangement where two or more such closed loops share the same circulating unit. In such a case, the number of cooling units also depends on whether the loops that are positioned on intersecting planes are internally connecting such that they provide a single liquid circulating unit. The alternative being a structure where each independent closed fluid (piping) loops are positioned on intersecting planes and being disposed on top of one another. In addition, the circulator units can also be housed together or separately, as selectively desired to maximize cooling needs and storage management.

Figure 2:
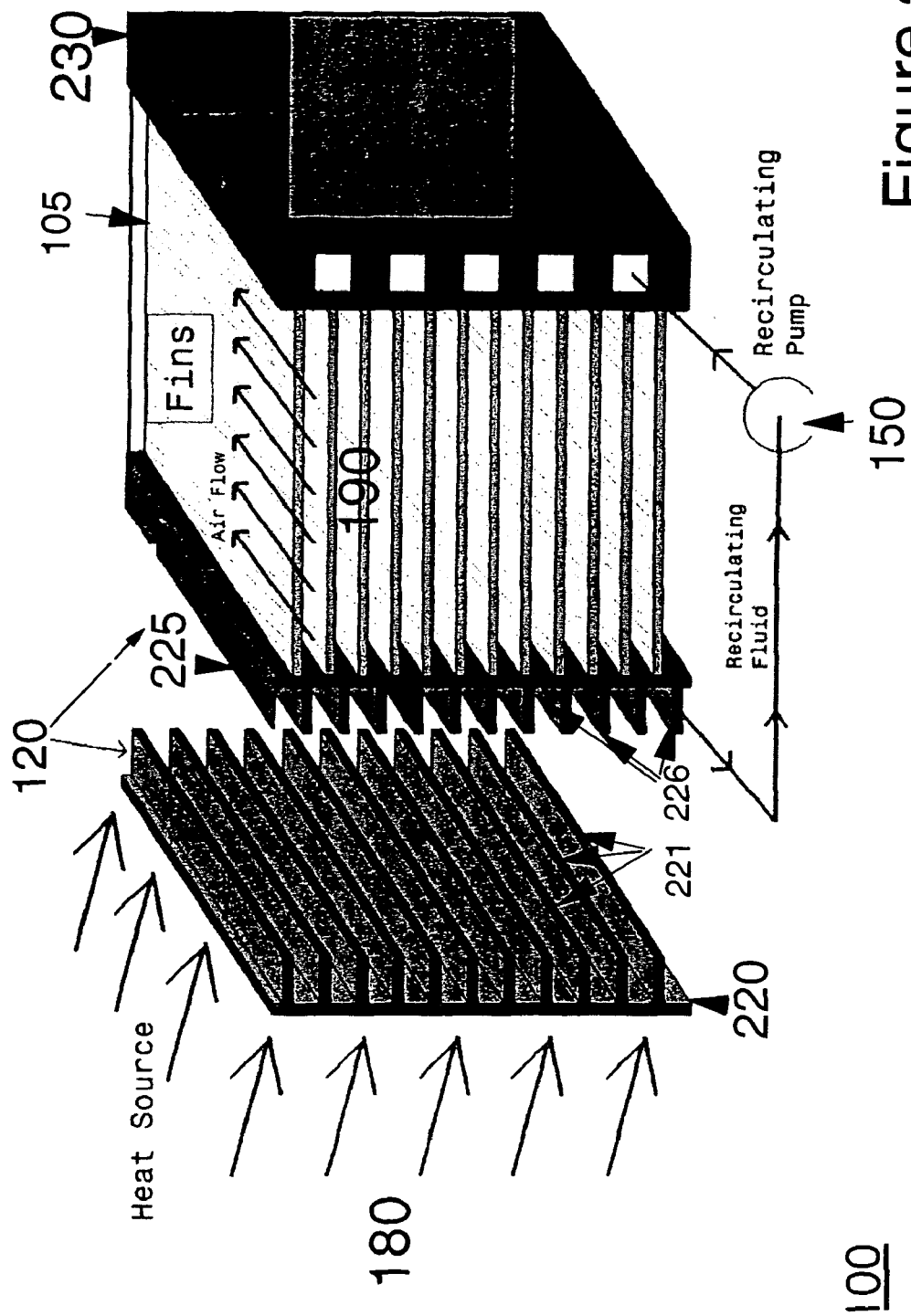
FIG. 2 is a cross sectional illustration of the embodiment provided in FIG. 1 showing further details of interleaving fins.

FIG. 2 provides for a detailed illustration of a preferred embodiment of FIG. 1. The cross sectional illustration of FIG. 2, depicts the heat source plate 120 as being comprised of two sectional halves when brought together form the unitary heat source plate 120 of FIG. 1. Each complementary half 220 and 225 will be hereinafter referenced accordingly as heat spreader complementary half 220 and second complementary half 225.

Each of the complementary halves comprise fins 221 and 226, positioned such that when the two halves 220 and 225 are brought together, the fins 221 and 222 form an interleaving structure. The interleaving structure however, as discussed before, allows passage of fluid coolants and insertion of loops such as piping loops 145/146.

In order to provide the interleaving structure of heat source plate 120, the fins 221 and 226 will be formed and positioned complementarily to also provide a secure and fluid sealed unit. Therefore, in cases where multiple coolants are to be provided in multiple loops, other arrangements have to be made such that the interleaving structure does not allow for intermingling of coolant fluids.

It should be noted that in the embodiment of FIGS. 1 and 2, the fins 221 and 226 are designed to extend at least substantially along the width of each plate halves 220 and 225. This is not a requirement as will be later discussed in conjunction with FIG. 3. In addition, the fins 221 and 226 on each plate 220 and 225 are provided in parallel planes with respect to one another, which is also not a requirement for all embodiments.

In the embodiment provided in FIG. 2, similar to what was discussed in conjunction with FIG. 1, piping loops 145 or 146 selectively will provide coolant fluids into the interleaving halves once they are secured to one another for circulation. Depending on the preferred structural method, the coolant fluid will either be pumped or just flow into the interleaving structure by gravitational forces (piping 146) and will be collected by other piping loop (145) for circulation which is conducted by the pump 150.

It should be noted that while the preferred embodiment of FIGS. 1 and 2 provide for an interleaving design, other such similar design can be implemented that is similar to the interleaving design. One example, would be a serpentine design that can also be easily implemented in similar complementary sectional manner as that discussed in conjunction with FIG. 2 above.

FIG. 3 provides for a preferred embodiment of the present invention. In FIG. 3, a perspective illustration of a cross sectional arrangement of the preferred embodiment is provided. The embodiment of FIG. 3 provides direct on-chip cooling which greatly address heat dissipation needs in a location that is most needed.

In FIG. 3, while the interleaving design concept of FIGS. 1 and 2 is utilized, to address on-the-chip cooling, this concept is further enhanced to achieve better performance. The heat source plate 320 is still comprised of sectional components as was discussed in FIGS. 1 and 2. In this embodiment, the heat source plate 320 is comprised of a substrate 321 itself where the electronic components will be directly mounted, and a complementary half 325. Preferably, a fluid seal structure 329, can also be provided to avoid fluid seepage.

As illustrated, the fins halves 322 for the substrate 321 are provided on the opposing side. The fins 322, while still provide an interleaving design, are now individually dispersed on the opposing side of the substrate 321 and have a semi-circular or "c" shaped structure. This is somewhat different than the design of FIG. 2 where the fins were extended over a substantial width of the heat source spreader plate 320. In this design, the individual upper and lower fin portions 323 and 324 are connected by section 327. The upper and lower fin portions 323 and 324 are placed such that they interleave with the fins 326 on the air heat sink spreader plate portion 325. The upper and lower fin portions 323 and 324 are in parallel planes with one another and with fins 326 of the air heat sink spreader plate portion 325. This, however, is not a requirement and other designs can be selectively implemented.

Each individual fin 322 can be placed on the same parallel plane with respect to other fins 322 or the placement of the fins 322 with respect to each other can be varied as long as they provide an interleaving structure when assembled with the fins 326 of the complementary half plate 325. In addition, while the individual fins 322 in the illustration of FIG. 3, seem to be provided equidistant from one another, in alternate embodiments, this particular feature can also be selectively altered.

It should be noted that while in the illustration of FIG. 3, semi-circular or C-shaped structures are used for the fins 322 other shapes can be used that comprise of multilevel fin portions similar to upper and lower portions 323 and 324. It is also possible that the heat sink attached to the chips could be bigger than the chip itself. The example of FIG. 3, therefore, is only provided for ease of understanding and as one of the possible embodiments of the present invention.

As before the interleaving of the two complementary plate portions (or substrate in this case) 320 and 325 has to be conducted as before in a manner that sufficient space is provided for the flow of fluids and insertion of piping loops 346-347.

In addition, although the fins 327 of the complementary plate 325 are still designed structurally to resemble the fins of FIGS. 1 and 2, this can also be varied selectively and if desired individual fins such as the ones provided on the substrate 320 can also be fabricated.

As mentioned earlier, In the preferred embodiment of FIG. 3, in order to provide a fluid tight sealed, a substrate to heat sink seal 329 is also provided. In certain circumstances, based on the non electrically conducting coolant used, it may also be necessary to provide some form of a seal or similar arrangements to avoid the any unintended leaks. One such seal is provided and referenced as 329. The seal 329 can be designed in a variety of manner as known to those skilled in the art. For example, the seal 329 can partially overlap the thickness of the vertical portion of the spreader plates 351 and 352 and even include elastic gaskets in some places to further avoid any potential leaks.

The remaining structural and functional design of FIG. 3 is similar to what was already discussed in conjunction with FIGS. 1 and 2 and does not necessitate additional discussion.

It should be noted, however, that while the embodiments of FIGS. 1 through 3 are provided to reflect vertically placed heat sinks 100 and 300, the orientation of the heat sinks 100 and 300 does not affect the workings of the present invention. The only requirement, in orientation of the heat sinks 100 and 300 would be with respect to allowing air to flow easily thought the fins 310 and 110 of the finned structure 105 and 305.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A liquid and air cooled heat sink used for cooling of adjacent electronic components, comprising:
    a heat source plate configured to receive a cooling fluid, the heat source plate including a plurality of fluid-cooled fins configured to contact the cooling fluid;
    a second plate including a plurality of channels therein, the channels configured to receive the cooling fluid;
    a finned structure including a plurality of air-cooled fins, the finned structure secured between the heat source plate and the second plate such that the heat source plate and the second plate are in thermal communication with the plurality of air-cooled fins;
    a fluid re-circulator disposed at least partially in the heat source plate and the second plate for circulating the cooling fluid through the heat source plate and the second plate, the fluid re-circulator excluding the cooling fluid from said finned structure.

2. The heat sink of claim 1, wherein said heat source plate further comprises of two complementary halves each with complementary fins positioned such that when said two complementary halves are brought together, said complementary fins form an interleaving structure that allow for passage of fluid coolants through them while forming a unitary fluid sealed plate.

3. The heat sink of claim 2, wherein said second plate has perforations to allow at least partial embedding of said fluid circulator.

4. The heat sink of claim 3, wherein said fluid re-circulator passes through said interleaving fins of said heat source plate.

5. The heat sink of claim 4, wherein said fluid re-circulator comprises of at least one fluid loop and at least a circulating fluid pump.

6. The heat sink of claim 5, wherein said fluid loop comprise of piping.

7. The heat sink of claim 6, wherein said piping can partially pass through one or more of said perforations.

8. The heat sink of claim 7, wherein a plurality of fluid loops are provided, each loop being at least partially embedded in one of the heat source plate and the second plate.

9. The heat sink of claim 8, wherein said coolant fluid is a non-conducting fluid.

10. The heat sink of claim 9, wherein said complementary fins on said heat source plate halves extend substantially over the width of said complementary halves.

11. The heat sink of claim 2, wherein one of said complementary halves of said heat source plate is a substrate housing electronic devices.

12. The heat sink of claim 11, wherein said substrate provides for interleaving fin halves on its opposing side.

13. The heat sink of claim 12, wherein a plurality of individually shaped fins are provided on said opposing side of said substrate such that they form an interleaving structure when said substrate is brought together with said second complementary half of said heat source plate.

14. The heat sink of claim 13, wherein a fluid seal is disposed between said substrate and said second complementary plate.

15. The heat sink of claim 14, wherein said individually shaped fins are semi-circular in structure.

16. The heat sink of claim 15, wherein said individually shaped fins are disposed on parallel planes and equidistant to one another.

17. The heat sink of claim 16, wherein at least some of said individually shaped fins are provided on same parallel planes.

18. The heat sink of claim 13, wherein a fluid seal is disposed between said substrate and said second complementary plate.

19. A liquid and air cooled heat sink disposed close to electronic components and used for cooling such components, comprising:
    a heat source plate configured to receive a cooling fluid, the heat source plate including a plurality of fluid-cooled fins configured to contact the cooling fluid, the heat source plate including a substrate with individually shaped fins and a second finned plate having complementary fins to said substrate such that when said substrate and said finned plate are brought together, said substrate and plate fins interleave forming a single unitary heat source plate that is fluid sealed with said interleaving fins being sufficiently spaced to allow passage of the coolant fluid;
    a second plate including a plurality of channels therein, the channels configured to receive the cooling fluid;
    a finned structure including a plurality of air-cooled fins, the finned structure secured between the heat source plate and the second plate such that the heat source plate and the second plate are in thermal communication with the plurality of air-cooled fins;
    a fluid re-circulator disposed at least partially in the heat source plate and the second plate for circulating the cooling fluid though the heat source plate and the second plate, the fluid re-circulator excluding the cooling fluid from said finned structure.

20. A method of cooling electronic components using a liquid and air cooled heat sink disposed close to electronic components, comprising:
    forming a heat source plate configured to receive a cooling fluid, the heat source plate including a plurality of fluid-cooled fins configured to contact the cooling fluid, the heat source plate including a first and a second half disposed on one another, said fluid-cooled fins from said first half interleave with said fluid-cooled fins from said second half to make a unitary plate that is fluid sealed with said interleaving fins being sufficiently spaced to allow passage of the cooling fluid;

forming a second plate, the second plate including a plurality of channels therein, the channels configured to receive the cooling fluid;

securing a finned structure between the heat source plate and the second plate, the finned structure including a plurality of air-cooled fins, the finned structure secured such that the heat source plate and the second plate are in thermal communication with the plurality of air-cooled fins; and disposing a fluid re-circulator at least partially in the heat source plate and the second plate for circulating the cooling fluid though the heat source plate and the second plate, the fluid re-circulator excluding the cooling fluid from said finned structure.

* * * * *